United States Patent [19]
Katevenis

[11] Patent Number: 5,774,653
[45] Date of Patent: Jun. 30, 1998

[54] HIGH-THROUGHPUT DATA BUFFER

[75] Inventor: Manolis Katevenis, Iraklio, Greece

[73] Assignee: Foundation of Research and Technology-Hellas, Crete, Greece

[21] Appl. No.: 506,019

[22] Filed: Jul. 24, 1995

[30] Foreign Application Priority Data

Aug. 2, 1994 [GR] Greece .................................. 940100383

[51] Int. Cl.⁶ .................................................. G06F 13/00
[52] U.S. Cl. ........................................................ 395/200.3
[58] Field of Search .......................................... 395/200.3

[56] References Cited

U.S. PATENT DOCUMENTS

| | | | |
|---|---|---|---|
| 4,602,331 | 7/1986 | Sheth ........................................ | 395/250 |
| 5,222,047 | 6/1993 | Matsuda et al. ..................... | 365/230.03 |
| 5,313,501 | 5/1994 | Thacker ................................... | 375/117 |
| 5,454,093 | 9/1995 | Abdulhafiz et al. ..................... | 395/460 |
| 5,537,640 | 7/1996 | Pawlowski ............................... | 395/473 |

FOREIGN PATENT DOCUMENTS

| | | |
|---|---|---|
| 36 44 322 | 7/1988 | Germany . |
| 58-115674 | 7/1983 | Japan . |
| WO 94/29870 | 12/1994 | WIPO . |

OTHER PUBLICATIONS

Manolis Katevenis, "Weighted Round–Robin Cell Multiplexing in a General–Purpose ATM Switch Chip", IEEE Journal on Selected Areas in Communications, vol. 9, No. 8, Oct. 1991, pp. 1265–1279.

*Primary Examiner*—David Y. Eng
*Attorney, Agent, or Firm*—McDermott, Will & Emery

[57] ABSTRACT

The invention relates to a pipeline buffer for simultaneously transferring N words at each of a succession of clock cycles (CK), comprising N one-word side memories (M0–M3) successively connected such that successive memories each are accessed with one clock cycle delay. The N memories are subjected to the same read or write cycles by control circuitry.

6 Claims, 6 Drawing Sheets

HIGH-THROUGHPUT DATA BUFFER

1. Technical Field of the Invention

The present invention relates to a high-throughput buffer, and more particularly to the use of such buffers in data switches.

The throughput of a buffer is defined as the number of bits that can be transferred to or from the buffer per unit of memory, it is conventional to use the so-called technique of interleaving.

2. Background of the Invention

FIG. 1 illustrates the technique of interleaving. A plurality of memory banks, four in this example M0 to M3, are connected to a fast address bus A through respective address registers AR0 to AR3 and to a fast data bus D through respective data registers DR0 to DR3. The data to be transferred on bus D are words of w bits and each memory bank is w bits wide. The memory banks are accessible at a maximum rate (slow cycles) determined by their access time. It is wished to transfer the data at a faster rate (fast cycles), four times faster in the described example.

Hereinafter, by "providing an address", it is understood that corresponding read or write enable signals are also provided.

Control circuitry, not shown, decides, at each fast cycle, which memory bank is to be accessed and enables the corresponding address and data registers. Whenever consecutive fast accesses are directed to different memory banks, the buffer operates at the desired high speed, while each memory bank is only accessed once every slow cycle. The throughput of the buffer is then four words per slow cycle (or one word per fast cycle). The throughput decreases, for example, if two words that happen to reside in the same memory bank must be accessed, one after the other, because this memory bank can then only be accessed at the next slow cycle, which blocks the second access to the buffer for each fast cycle to come before this next slow cycle.

This situation will never happen, in the example of FIG. 1, if words are always accessed (transferred) in groups (blocks, packets) of multiples of four, where consecutive words in the group (packet) correspond to consecutive addresses in distinct memory banks.

FIG. 2 shows a simplification of the buffer of FIG. 1 in the case where words are transferred by packets of multiples of four, and all packets are aligned on address boundaries that are also multiples of four. The four memory banks of FIG. 1 are merged into one four-word wide memory 10. Memory 10 is connected to an address bus A which is provided with one address per slow cycle. Successive groups of w bits of the 4w-bit memory bus are connected to data bus D through respective data registers DR0 to DR3.

During four consecutive fast write cycles, four words of an incoming packet are successively written in registers DR0 to DR3. At the fourth write cycle, an address is provided to the memory and the contents of all four registers DR0 to DR3 are simultaneously written into the memory. In order to read four words of a packet, an address is provided to the memory and the four corresponding words are simultaneously loaded into registers DR0 to DR3. These registers are then read successively at the rate of the fast cycles.

A buffer of the type of FIG. 2 is particularly adapted to be used in a data switch. Data switches are building blocks for networks consisting of point-to-point links. Each switch has a number of input and a number of output links connecting it to other switches and/or terminal equipment. The function of a switch is to:

receive packets arriving from the input links (a packet consists of a header, identifying a destination in the network, and a body containing data to be delivered to that destination);

examine the header of each incoming packet, and determine, according to its destination, which output link the packet must be forwarded along; and whenever an output link becomes free, select one of the packets waiting to be forwarded along that link, and send it out.

Since the destinations of the incoming packets are not known or scheduled in advance, contention will often arise, i.e. two or more packets arriving simultaneously through different input links may have destinations such that they have to be forwarded along the same output link. Since the throughput of each output link is usually less than the total throughput of all input links, when contention occurs, it is not possible to immediately send out all incoming packets; some of them have to wait inside the switch, and go out at a later time, when the desired outgoing link is free. Packets that have to wait are stored in at least one buffer that must be provided in the switch for this purpose.

The buffer size is chosen according to the desired efficiency of the network, while its throughput must be at least as high as the sum of the throughputs of the input and output links. Often, a hand-shake system is provided between the elements of the network, such that each switch whose buffer is likely to overflow stops the transmission of packets to its input links until enough space in the buffer is freed. Thus, the least the buffer size, the more often it is likely to overflow, reducing the efficiency of the network.

There are many types of buffer organizations which, with a same total memory capacity, are more or less efficient.

The most efficient buffer organization is to have a single, shared buffer for all of the switch traffic. Such a shared buffer must be a multiport memory having as many ports as input links and output links. The true multiport memory is very expensive, because each storage bit must have multiple word lines and multiple bit lines, thus raising significantly the memory cost per bit. As a result, for almost every application other than the smallest memories (registers), approximations are used when a multiport memory is needed. The usual and general technique for such approximations is the interleaving explained in connection with FIGS. 1 and 2.

FIG. 3 shows a simple example of a switch with two input links INa, INb, and two output links OUTa, OUTb, using a single, shared buffer organized as in FIG. 2. This type of switch is described in IEEE Journal on Selected Areas in Communications, Vol. 9, No. 8, Oct. 1991, "Weighted Round-Robin Cell Multiplexing in a General-Purpose ATM Switch Chip". This switch is adapted to transferring words of w bits in packets of four words or a multiple thereof. The throughput of each link is one word per cycle, so the throughput of the buffer must be four words per cycle.

The switch comprises a four-word wide memory 10 receiving an address A at each cycle. Each input link INa, INb, is connected to four w-bit input registers, respectively IR0a to IR3a and IR0b to IR3b. The outputs of the four input registers IRa, IRb, associated to each input link are connected to a 4w-bit register, respectively IWR$a$ and IWR$b$, whose output can feed the data bus of memory 10.

Each output link OUTa and OUTb is fed by the output of a respective three-input multiplexer 12$a$ and 12$b$. A first input of each multiplexer is connected to the outputs of four respective w-bit output registers OR0a to OR3a and OR0b to OR3b via four tri-state drivers not shown in FIG. 3. The inputs of the output registers associated to each output link are connected to respective w-bit groups of the data bus of memory 10.

A second input of each multiplexer 12a, 12b, is connected to the outputs of registers IR0a to IR3a, and a third input of each of these multiplexers is connected to the outputs of registers IR0b to IR3b, again via tri-state drivers not shown in FIG. 3. This coupling to registers IR0a to IR3b is referred to as cut-through path.

Control circuitry, not shown, read-enables and write-enables each register to obtain the following operation. Four words of a packet coming on input link INa, for example, are successively written in registers IR0a to IR3a. Once the last word is written in register IR3a, the contents of registers IR0a to IR3a are simultaneously transferred into wide register IWRa, while the first word of the next quadruple or next packet is written in register IR0a. When memory 10 becomes free from other accesses to it, the content of wide register IWRa is transferred thereinto. Wide register IWRa is necessary because, once the fourth word has been stored in register IR3a, it is not sure that the contents of registers IR0a to IR3a can be written into memory 10 before the first word of the next packet is stored in register IR0a, thus overwriting the first word of the previous packet. The only thing that is certain is that memory 10 will be ready for receiving the four words of the packet until the fourth word of the next packet is written into register IR3a.

Four words of a packet coming on input link INb are processed similarly, in parallel to the processing of the packet on input link INa.

In order to send out four words of a packet, for example on output link OUTa, a wide word of memory 10, containing the four words of the packet, is loaded into registers OR0a to OR3a. The contents of registers OR0a to OR3a are successively provided on output link OUTa through multiplexer 12a. As soon as a wide word has been written in registers OR0a to OR3a, another wide word can be written in registers OR0b to OR3b in order to send out a packet on output link OUTb.

If an output link is free while a packet destined to this output link is being received and stored in registers IR0a to IR3a, for example, the multiplexer of the output link selects the outputs of registers IR0a to IR3a while these registers are successively read-enabled. The packet can then start being sent out as soon as its first word is stored in register IR0a. This operation is called cut-through, and it is very important in order to drastically reduce the delay of packets travelling through a lightly loaded network. Note that, when the whole packet is stored in registers IR0a to IR3a, it may still be transferred into wide register IWRa and then into memory 10. This is of no importance because the corresponding memory space will be considered as free.

The switch structure of FIG. 3 is complex in that it needs many registers, buses, and output multiplexers (cut-through cross-bar).

SUMMARY OF THE INVENTION

An object of the invention is to provide a particularly simple high-throughput buffer structure.

Another object of the invention is to provide a particularly simple switch structure using such a buffer.

The invention achieves these objects by providing a buffer having a pipelined memory organization. The buffer comprises N memories successively connected such that each memory is accessed like the preceding memory with one cycle delay. It takes N cycles for a packet of N words to be accessed: the first word is accessed in the first cycle, the second in the second cycle, and so on. However, in parallel with this N cycle packet access, N−1 more such accesses are in progress, at various stages of completion each, in a typical pipelined execution manner. Although the latency of each packet access is N cycles, the throughput is N words per cycle.

More specifically, in a pipeline buffer according to the invention, each memory has access control lines connected to the access control lines of the preceding memory through a one-clock cycle delay circuit, the access control lines of the first memory being intended to receive an address and a read or write signal at most at each clock cycle.

The invention also provides a data switch for transferring packets of a multiple of N words arriving at the rate of one word per clock cycle on any of N/2 input links, each to a selected one of N/2 output links. It comprises one pipeline buffer having N memories. Means are associated with each input link for providing consecutive words from the input link to the N memories in the order and at the rate these memories are consecutively subjected to a same write access. Means are associated with each output link for providing the outputs of the N memories to the output link in the order and at the rate these memories are consecutively subjected to a same read access. Means are finally associated with each memory for successively providing the memory with words present on the input links at the rate this memory is subjected to consecutive write accesses, and for successively providing the output links with the output of the memory at the rate this memory is subjected to consecutive read accesses.

An alternative data switch is provided for transferring packets of N/2 words arriving at the rate of one word per clock cycle on any of N/2 input links, each to a selected one of N/2 output links. It comprises two pipeline buffers each having N/2 memories. Means are associated with each input link for providing consecutive words from the input link to the N/2 memories of a first buffer in the order and at the rate these memories are consecutively subjected to a same write access, and for providing other consecutive words from the input link to the N/2 memories of the second buffer in the order and at the rate these memories are consecutively subjected to a same write access. Means are associated with each output link for providing the outputs of the N/2 memories of the first buffer to the output link in the order and at the rate these memories are consecutively subjected to a same read access, or providing the outputs of the N/2 memories of the second buffer to the output link in the order and at the rate these memories are consecutively subjected to a same read access. Means are finally associated with each memory of each buffer for successively providing the memory with the words present on the input links at the rate this memory is subjected to consecutive write accesses and for successively providing the output links with the output of the memory at the rate this memory is subjected to consecutive read accesses.

According to an embodiment of the invention, the data switch comprises registers for coupling each input link to each data bus of the memories, each register connected to a same input link being write-enabled with one cycle delay with respect to the preceding register connected to the input link, such that the registers connected to the same input link load consecutive words of a packet coming on this input link. Drivers couple each data bus to any of the output links, each driver associated with an output link being controlled like the preceding driver associated with the same output link, with one cycle delay. Control circuitry initiates the first memory of a buffer with write operations in synchronism with the read-enabling of the registers associated with the first memory and with read operations in synchronism with the control of a driver associated with the first memory, the addresses provided by the control circuitry being such that packets are transferred on corresponding selected output links in the order they arrived on the input links.

According to an embodiment of the invention, the control circuitry comprises means for determining a free output link to which a packet coming on an input link is to be transferred and for read-enabling the registers associated with the input link in synchronism with the enabling of the associated drivers.

According to an embodiment of the invention, the pipeline buffer is arranged such that each memory is a memory array comprising word lines which are connected to same word lines of a previous adjacent array through a one-clock cycle delay circuit, the word lines of the first array being controlled by an address decoder which receives an address at most at each clock cycle.

According to an embodiment of the invention, the memory arrangement comprises input lines and output lines oppositely arranged with respect to the memory arrays, the input, output and word lines being equally segmented by a one clock cycle delay circuit.

Additional objects, advantages and visual features of this invention will be set forth in part in the description which follows, and in part, will become apparent to those skilled in the art upon examination or may be learned by practice of the invention. The objects and advantage of the invention may be realized and obtained by means of the instrumentalities and combinations particularly pointed out in the appended claims.

BRIEF DESCRIPTION OF THE DRAWINGS

The foregoing and other objects, features and advantages of the invention will appear from the following description of preferred embodiments in connection with the accompanying drawings among which.

DESCRIPTION OF THE PREFERRED EMBODIMENTS

Figure 4:
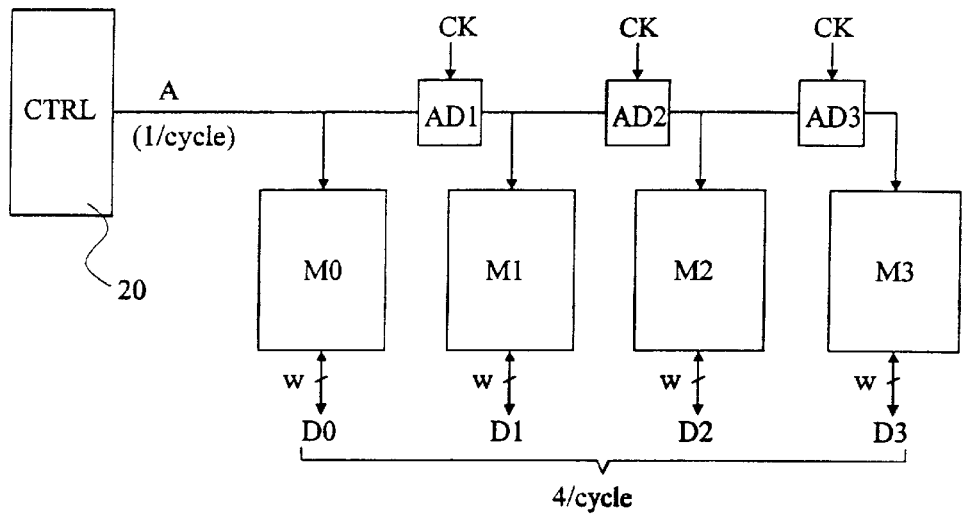
FIG. 4 shows an embodiment of a pipelined buffer according to the invention.

FIG. 4 shows an embodiment of an exemplary pipelined buffer according to the invention, adapted to transferring packets of four words (more generally N words) or a multiple thereof. The buffer comprises four w-bit wide memories (or memory banks) M0 to M3, where w is also the width of the words. The access control lines (address and read/write enable lines) of each memory M1 to M3 are connected to those of the preceding memory through a one access cycle delay circuit (a register), respectively AD1 to AD3. The access control lines of the first memory M0 receive addresses A and read/write control signals from a control circuit 20. Each delay circuit comprises, for example, a number of D-type flip-flops, one per line, enabled by a clock signal CK which synchronizes the word transfer cycles and access cycles. Each memory has a respective data bus D0 to D3.

If the buffer processes a continuous flow of packets, the control circuit 20 issues an address in each cycle. The memories are consecutively subjected to a same access (read or write) but each memory is subjected to different consecutive accesses, independent one of the other. For example, the four memories successively store four consecutive words at a same address. When one word is being stored in one memory, the three other memories are subjected to three other independent accesses, resulting from the transfers of three other packets of four words that are at different stages of completion. The total throughput of this buffer is thus four words per cycle.

Figure 5:
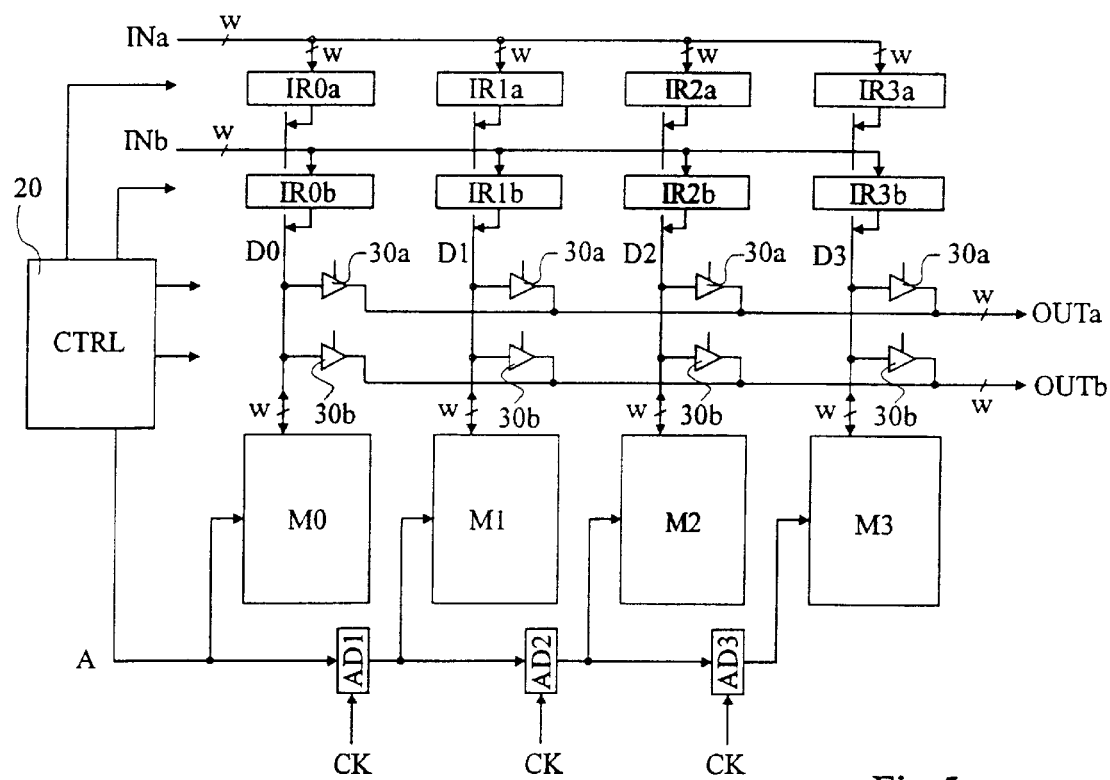
FIG. 5 shows an embodiment of a two-input/two-output data switch according to the invention, using the pipelined buffer of FIG. 4.

FIG. 5 shows an exemplary embodiment of a two-input INa, INb, two-output OUTa, OUTb, data switch using the pipelined buffer of FIG. 4. Input INa is connected to data buses D0 to D3 of the memories M0 to M3 through respective input registers IR0a to IR3a (having tri-state outputs). Input INb is connected to data buses D0 to D3 through respective input registers IR0b to IR3b with tri-state outputs. Output OUTa is connected to data buses D0 to D3 through respective tri-state drivers 30a and output OUTb is connected to data buses D0 to D3 through respective tri-state drivers 30b.

Like the memories, the registers associated to each input and the tri-state drivers associated to each output are controlled in a pipelined manner. Each register associated to each input is controlled (write-enabled or read-enabled) like the preceding register with one cycle delay, and each tri-state driver associated to each output is controlled (enabled or not) like the preceding driver with one cycle delay. Delay circuits for controlling the registers and the drivers in a pipelined manner are not shown for clarity of the figure.

The control circuit 20, while providing an address to first memory M0 at each cycle also initiates the controls of the registers and drivers connected to this first memory through data bus D0 in a manner explained below.

The operation of the switch is in summary as follows. At a first cycle, a first of a quadruple or packet of words arrives at an input IN, and register IR0 of the corresponding input is write-enabled, whereby the first word is held in register IR0. At the second cycle, the second word of the packet arrives. Like register IR0 at the first cycle, register IR1 is now write-enabled and will hold the second word of the packet. This write-enabling of IR1 results from the delayed write-enable signal of IR0, without any need for direct intervention by the control circuit 20. Similarly, at the third cycle, the third word of the packet arrives and is written into IR2, and at the fourth cycle, the fourth word is written into IR3.

In parallel with the above quadruple of words arriving at a certain input and being written into the corresponding quadruple of input registers IR0 to IR3, other quadruples of words may be arriving through other inputs. At the cycle when the first word of each quadruple arrives, control circuit 20 initiates its writing into the corresponding register IR0. All these writings then proceed in parallel and independently of each other.

Considering again the first word which is written into register IR0 at the first cycle. This word must be transferred into memory M0 before it is overwritten in register IR0 by the first word of a next quadruple, which may arrive at the fifth or any subsequent cycle. Thus, the transfer of the initial word into memory M0 must occur at anyone of the second to fifth cycles. For simplicity, assume that this transfer happens at the second cycle. In order for it to happen, control circuit 20 generates, at the second cycle, a first address A0 of the memory M0 where this word must be written, and also generates a read-enable signal for register IR0 and a write-enable signal for memory M0. Thus, the first word is written into memory M0 at the first address.

At the third cycle, the first address reaches memory M1 and, like register IR0 at the second cycle, register IR1 is now read-enabled, whereby the second word is written in memory M1 at the first address. Similarly, the third and fourth words will be written into memories M2 and M3, at the first address, at the fourth and fifth cycles respectively.

Besides writing incoming packets into memories M0 to M3, these memories are also used for reading outgoing packets and forwarding them to the outputs. Assume that immediately after writing the above first quadruple of words into memories M0 to M3, it is desired to read and send out a second (or the same) quadruple of words, from a second (or the same) address of memories M0 to M3. To achieve this, at the third cycle, the second address is provided to memory M0 which is read-enabled and presents an output word on data bus D0. The associated tri-state driver 30 is at the same time enabled, whereby the output word is presented at a corresponding output OUT.

At the fourth cycle, while the fourth word of the input packet is being written into register IR3 and the third word being written into memory M2 at the first address, a second output word is read from the second address of memory M1 and transferred to the output. At the same time, memory M0 receives a third address and either transfers a word to another output or receives a word held in register IR0 of another input, and so on.

Now, consider how cut-through is done. As soon as a register IR0 holds a first word of an incoming packet, if the output to which this packet must be transferred is free, the word is transferred to this output at the next or another subsequent cycle by both read-enabling register IR0 and enabling the corresponding tri-state driver 30. At the next three cycles, the three following words of the packet are successively sent out in the same manner from registers IR1 to IR3. The words of the packet that cuts-through may or may not be written into memories M0 to M3 as they cut-through. It is also possible to first write the content of register IR0 into memory M0, and immediately or soon after that read it out of memory and send it to the output. As long as the output receives the first word of the packet before the last word of the packet is written into the last register IR, this operation is still equivalent to the normal cut-through.

Figure 3:
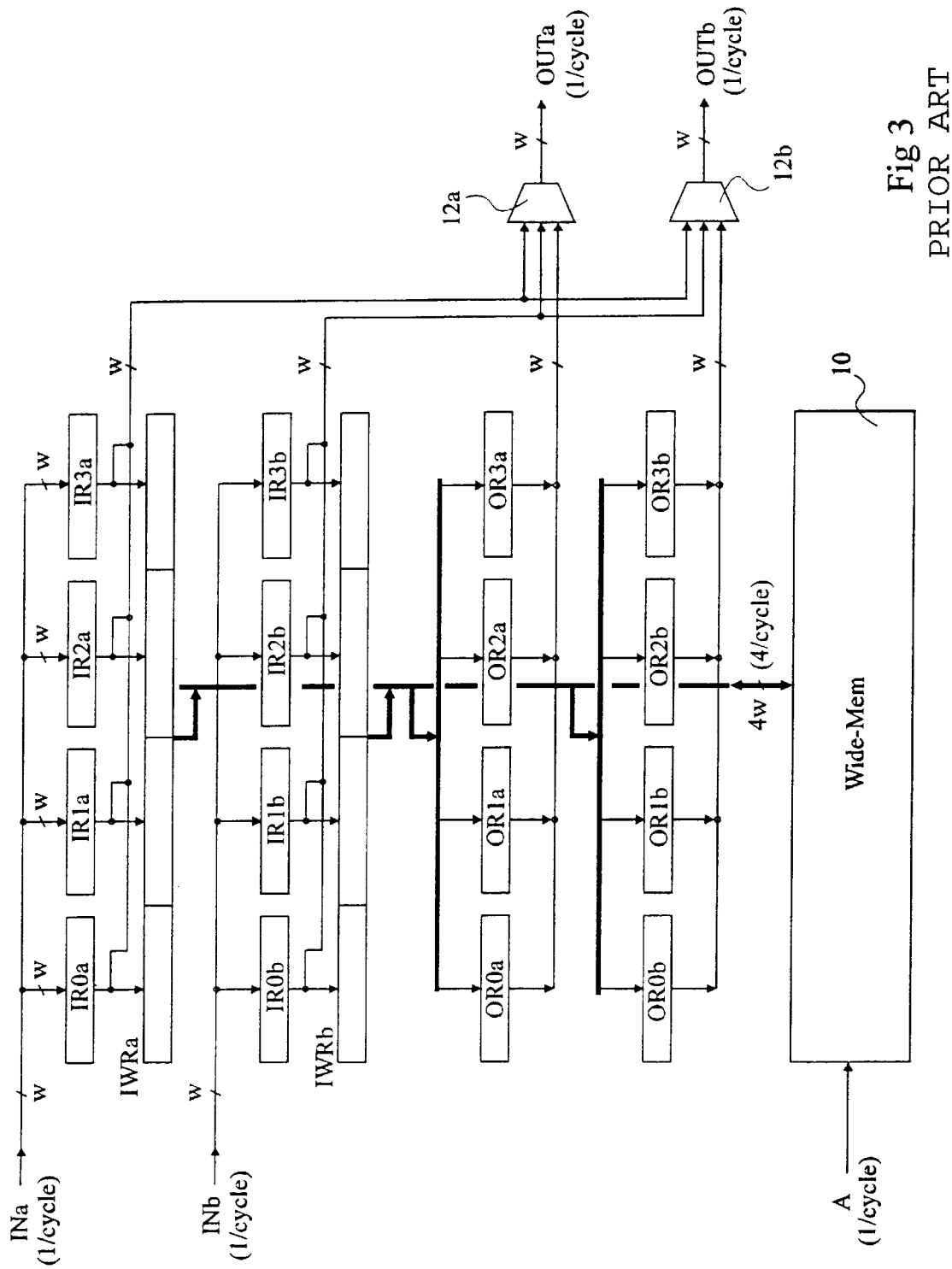
FIG. 3, previously described, shows an exemplary data switch using the buffer structure of FIG. 2.

The switch according to the invention has the same performance as the switch of FIG. 3 but has three times less word registers and no specific cut-through circuitry (cut-through paths and multiplexers 12a, 12b of FIG. 3).

Of course, the switch according to the invention needs address delay circuits AD1 to AD3, but such delay circuits are usually of much smaller size than word registers. The complexity of the control circuit 20 is similar to that of the switch of FIG. 3, or even simpler, because cut-through decisions are easier in FIG. 5 (in FIG. 3, cut-through is not possible after a packet goes into register IWR and before it is written into memory).

Figure 6:
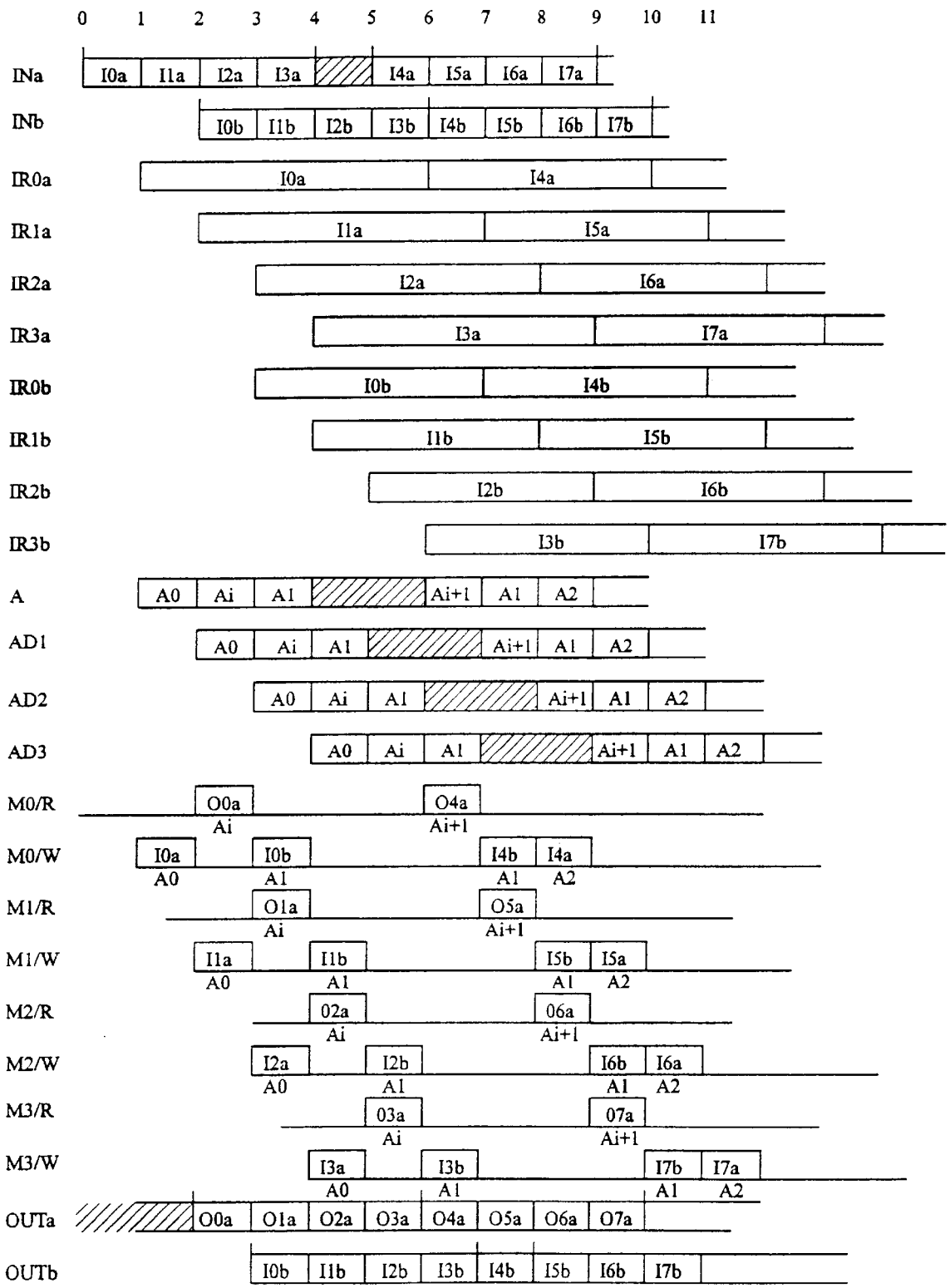
FIG. 6 illustrates an exemplary sequence of data flow in the switch of FIG. 5.

FIG. 6 shows an exemplary transfer sequence achieved by a switch according to the invention. This figure shows successive words Ia, Ib, coming on inputs INa and INb, the contents of registers IR0a to IR3b, read (M/R) and write (M/W) accesses of memories M0 to M3, and successive words Oa, Ib sent out on outputs OUTa and OUTb. Successive cycles are designated by numbers increasing from 0.

At a cycle 0, the first word of a packet of four words I0a to I3a arrives at input INa. This first word I0a is written into register IR0a, and stays there until it is overwritten by the first word of another packet arriving through input INa, that is in cycle 5 in this example.

At cycle 1, the arriving word I1a is placed into register IR1a. A write address A0 is provided to memory M0 while register IR0 is read-enabled. Address A0 corresponds to the location where the words I0a to I3a are to be written in memories M0 to M3. Thus, the content I0a of register IR0a is written into memory M0 at address A0. Address A0 also arrives at the input of address delay circuit AD1.

At cycle 2, word I2a is written into register IR2a. The first word of a packet I0b to I3b arrives at input INb and is placed into register IR0b. A read address Ai is provided to memory M0, corresponding to a packet to be sent out on output OUTa, while the corresponding driver 30a is enabled. The first word of this output packet O0a to O3a is read from memory M0 at address Ai and simultaneously sent out on output OUTa. The word I1a is transferred from register IR1a into memory M1 at address A0. Address Ai arrives at the input of address delay circuit AD1 and address A0 at the input of address delay circuit AD2.

At cycle 3, words I3a and I1b are written into respective registers IR3a and IR1b. A write address A1 is provided to memory M0, corresponding to the location where the words I0b to I3b are to be written in memories M0 to M3. The output OUTb to which packet I0b to I3b is destined is free. As word I0b is transferred from register IR0b into memory M0 at address A1, it is also transferred to output OUTb by enabling the corresponding tri-state driver 30b. The second word O1a of the output packet is read from memory M1 at address Ai and sent out. Word I2a is transferred from register IR2a to memory M2 at address A0.

At cycle 4, nothing arrives on input INa and word I2b on input INb is placed into register IR2b. Word I1b is transferred from register IR1b to output OUTb and into memory M1 at address A1. Word O2a is read in memory M2 at address Ai and transferred to output OUTa. Word I3a is transferred from register IR3a into memory M3 at address A0. No address is provided to memory M0 because no data are ready to be transferred to or from that memory. Thus, memory M0 is idle.

At cycle 5, the first word of the next packet I4a to I7a arrives on input INa. This new packet is destined to output OUTa. Incoming words I4a and I3b are respectively written into registers IR0a and IR3b. Word I2b is transferred from register IR2b to output OUTb and into memory M2 at address A1. Output word O3a is transferred from address Ai in memory M3 to output OUTa. Memories M0 and M1 are idle.

At cycle 6, a first word of the next packet I4b to I7b on input INb arrives. This new packet is destined to output OUTb. Incoming words I5a and I4b are written into respective registers IR1a and IR0b. A read address Ai+1 is provided to memory M0 and corresponds to a new packet O4a to O7a to be sent out on output OUTa. This new address does not correspond to the new incoming packet I4a to I7a for reasons explained below. Word O4a is read in memory M0 at address Ai+1 and transferred to output OUTa. Word I3b is transferred from register IR3b to memory M3 at address Al and to output OUTb. Memories M1 and M2 are idle.

Up to cycle 6, a word was transferred from an input register into memory or to an output as soon as it was ready for transfer, i.e. one cycle after it was written into the register. However, at cycle 6, word I4a is ready for transfer into memory M0, but word O4a was read instead from memory M0. It will often happen that, in one cycle, data is both ready to be read and written in the same memory. A priority scheme must then be applied. In the present example, the highest priority is given to the words transferred from memory or directly from an input register to an output because it is wished to maintain maximum output utilization, while lower priority is given to words transferred from the input registers to memory since these can wait without causing any performance degradation. As long as the total buffer throughput is at least as much as the sum of the throughputs of all incoming and all outgoing links, it is guaranteed that no input data will ever be lost due to this policy. The same priority management must be achieved in the conventional switch of FIG. 3.

At cycle 7, word I6a from input INa and word I5b from input INb are written into respective registers IR2a and IR1b. Write address A1 is provided again to memory M0 and now corresponds to where packet I4b to I7b is to be written in memories M0 to M3. Since the packet (I0b to I3b) previously stored at address Al in memories M0 to M3 has already been sent out, it can be overwritten by new packet I4b to I7b. Word I4b is transferred from register IR0b to output OUTb and into memory M0 at address A1. Word I4a is ready to be transferred into memory M0, but will only be transferred at the next cycle because word I4b has higher priority. Word O5a is read at address Ai+1 in memory M1 and transferred to output OUTa. Memories M2 and M3 are idle.

At cycle 8, words I7a from input INa and I6b and from input INb are written in respective registers IR3a and IR2b. An address A2 is provided to memory M0, corresponding to the address where words I4a to I7a are to be stored in memories M0 to M3. Word I4a is finally transferred from register IR0a into memory M0 at address A2. Word I5b is transferred from register IR1b to output OUTb and into memory M1 at address A1. Output word O6a is read in memory M2 at address Ai+1 and transferred to output OUTa, and so on until the last words I7b, I7a, and O7a are respectively transferred to output OUTb, written in memory M3 at address A2, and transferred to output OUTa from address Ai+1 in memory M3.

Those skilled in the art will be able to realize the control circuitry of the buffer according to the invention basing themselves upon the control circuitry of the conventional switch of FIG. 3 and the above description of the functions it must ensure.

Those skilled in the art will also be able to modify the switch of FIG. 5 in obvious ways, in order for it to meet their requirements. For example, the number (M) of inputs and the number (N-M) of outputs can be varied, independently of each other, and can even be equal to one. The number (N) of stages (memories) is then adjusted accordingly. In this way, the buffer can be adjusted to switches with various fan-in and fan-out numbers, and various buffer organizations, for example single shared buffer, input queueing, output queueing, cross-point queueing, or cross-point in groups of a few inputs and a few outputs.

As another example of obvious adjustment of the switch of FIG. 5, if the clock cycle time is not enough to accommodate both a memory read operation as well as the driving of an output bus through a tri-state driver 30a or 30b in the same cycle, then an output register can be placed on each data bus D0 to D3, to act as an extra pipeline stage. Then, tri-state drivers 30a and 30b will be fed from the output of this register, rather than directly from the corresponding data bus D0–D3.

Figure 7A:
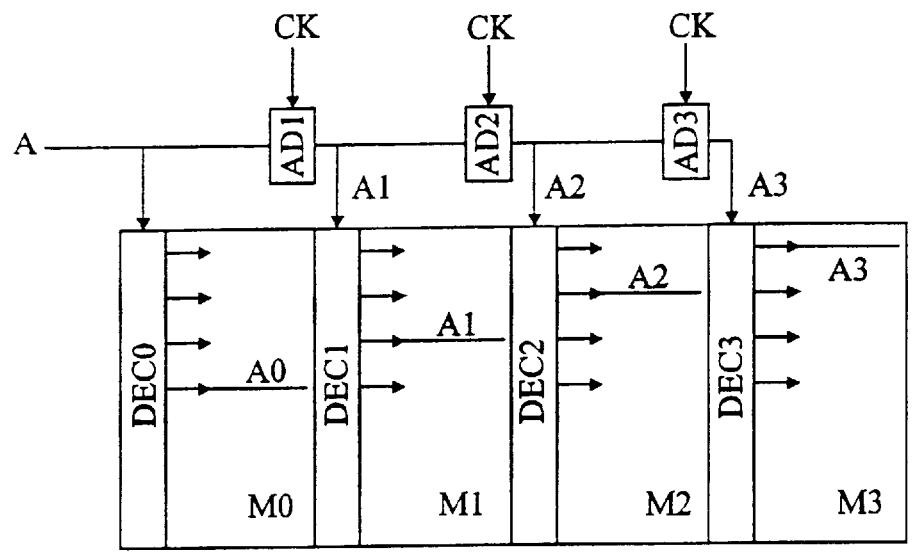
FIGS. 7A and 7B schematically show a straightforward integrated circuit floor plan and an optimized floor plan of a pipelined buffer according to the invention.

FIG. 7A shows a straightforward integrated circuit floor plan of a pipelined buffer according to the invention. Memories M0 to M3 correspond to four different conventional memory arrays having respective address decoders DEC0 to DEC3. Each decoder enables one word line of the array in response to the corresponding address. The four decoders receive respectively an address A and the outputs Al to A3 of the address delay circuits AD1 to AD3.

Figure 1:
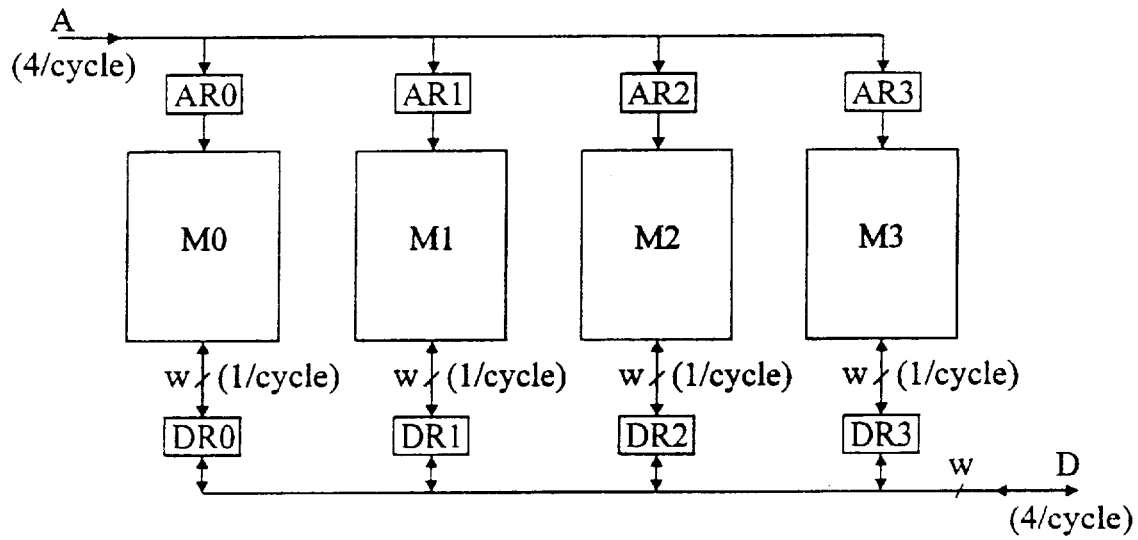
FIG. 1, previously described, illustrates a conventional interleaved high throughput buffer organization.
Figure 2:
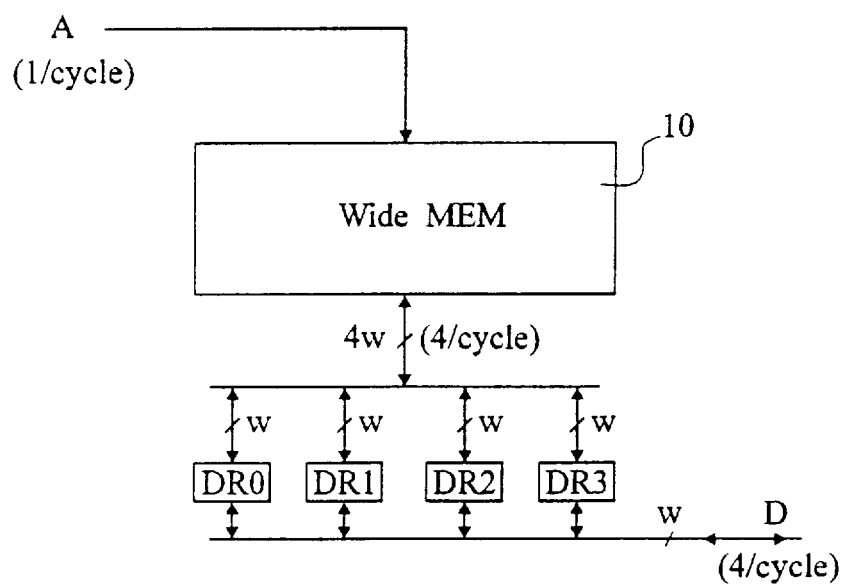
FIG. 2, previously described, shows a conventional wide-access buffer having high throughput, appropriate for block (packet) accesses.
Figure 7B:
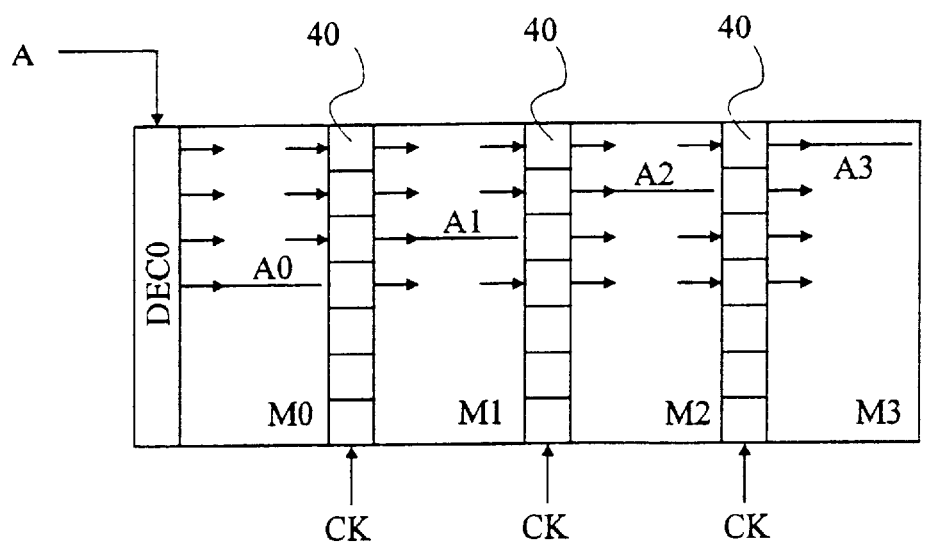

FIG. 7B shows an optimization according to the invention of the memory organization of FIG. 7A. Only memory array M0 has an address decoder DEC0, which receives the initial address A. Each word line of memory arrays M1 to M3 is connected to the same word line of the previous array through a delay circuit 40 of one clock cycle, for example a flip-flop enabled by clock signal CK. Thus, address delay circuits AD1 to AD3 are no longer needed and decoders DEC1 to DEC3 are replaced by columns of flip-flops. The resulting memory organization usually occupies less space than that of FIG. 7A, and consumes less power. Also, by comparison to the wide memory buffer of FIG. 2, the buffer according to the invention has shorter word lines, which reduces the delay caused by these word lines.

Figure 8:
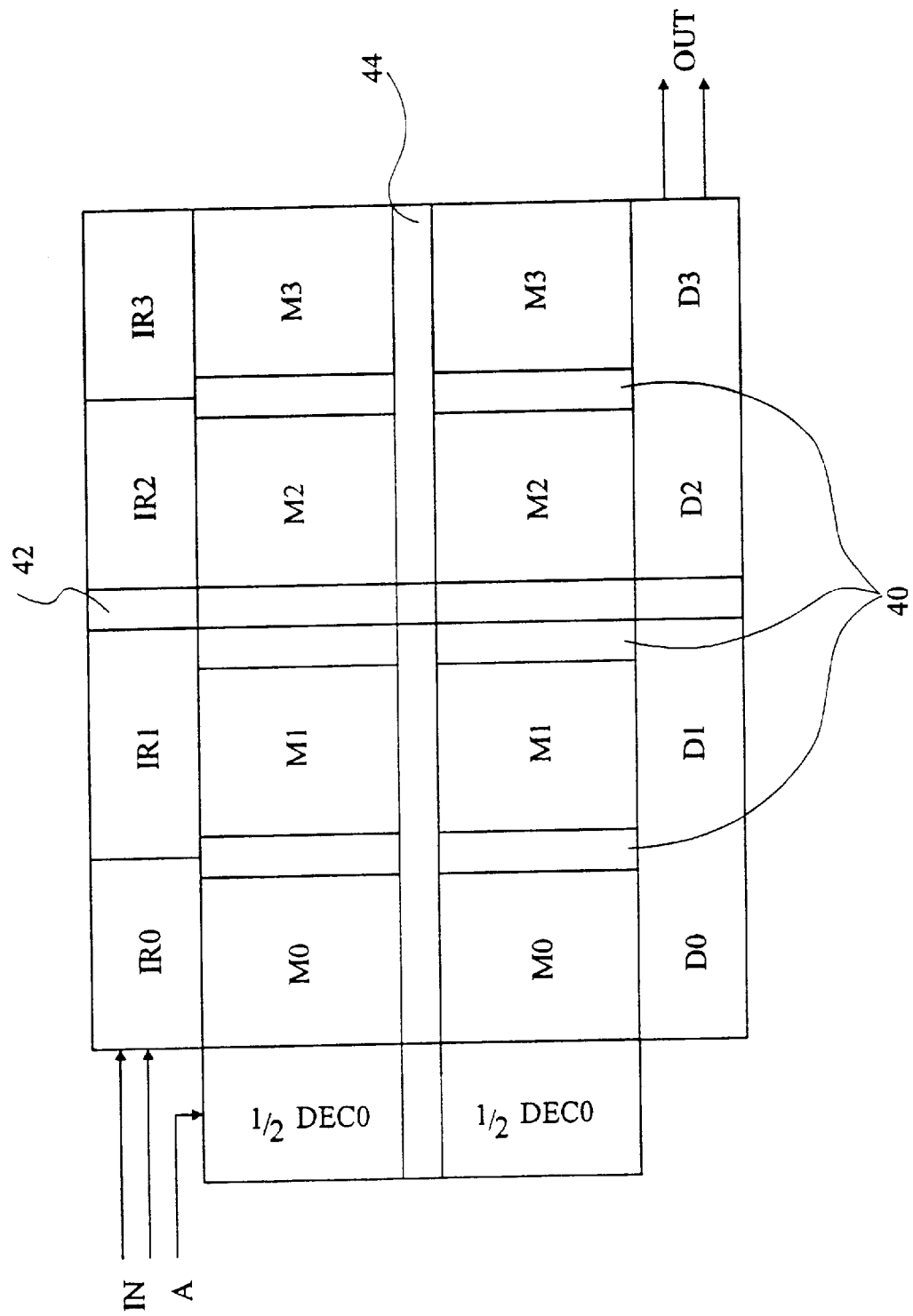
FIG. 8 shows the floor plan of FIG. 7B, optimized for long word and/or bit lines.

FIG. 8 shows a further optimization according to the invention of the memory organization of FIGS. 5 and 7B. Same elements are designated by same references. First, the output buses OUT are placed opposite to the input buses IN with respect to the memory arrays M. In FIG. 8, all data will always travel left-to-right and top-to-bottom. Additionally, all words will always travel through an equal physical distance on their way from the input to the output through memory, regardless of their order in the packet, and regardless of their memory address.

This uniform direction of data flow becomes very important as the integrated circuit (IC) technology progresses. As the IC technology progesses, the delay of wires increases. This leads, in general, to increased skew between the clock signal and the data signals, thus reducing the clock frequency. However, if the clock and the data signals travel through wires of similar lengths and in the same direction, then the relative skew is minimized. This can only be achieved when all data travel in the same direction, by making the clock also travel in that same direction. In the buffer according to the invention, this can be achieved by using the layout shown in FIG. 8.

Second, FIG. 8 illustrates how additional pipeline registers can be introduced, 42 in the horizontal and 44 in the vertical directions of data flow. Such registers become necessary when the length of wires increases beyond a certain limit; when this happens, the clock and data relative skews become hard to control, even with parallel running clock and data wires. In the example shown in FIG. 8, the input buses which run horizontally at the top of the circuit are segmented into two (or more) segments each by the pipeline register 42. The two successive segments of the input buses supply input registers IR0, IR1 and IR2, IR3 respectively.

At the bottom of the circuit, each output bus is similarly broken into two segments by register 42. Register 42 also compensates for the extra one cycle delay thus introduced in the packet words which cross the middle vertical axis.

If the bit lines are very long, a similar problem may be faced with them. As FIG. 8 shows, this can also be corrected by introducing the horizontal pipeline register 44 in the memory arrays. Each bit of this register consists of one sense amplifier/latch, receiving data read or forwarded from the top bit line, and one write/driver circuit, writing or forwarding data to the bottom bit line. In decoder DEC0, the circuitry controlling the word lines of the top half is similarly separated by register 44 from the circuitry controlling the word lines of the bottom half.

The extra pipeline registers 42, 44 do not affect the correct timing operation of the buffer and the switch. This is so because each and every word of each and every packet crosses each such pipeline register exactly once on its way from input to output, regardless of which word of the packet it is, and which memory address it is stored into. Thus, all words of all packets are delayed by an equal number of clock cycles by the introduction of the pipeline registers 42, 44, and thus the relative timing of the words and the packets remains unaffected.

The data switch according to the invention, having N memories to deal with N words simultaneously, appears to require that the packet size be a multiple of N words. However, a packet size of N/2 words can also be handled. Consider a pipelined buffer according to the invention with N/2 inputs and N/2 outputs and a throughput of N words per cycle. Since there are N/2 inputs and N/2 outputs and packets have N/2 words each, the buffer must be able to initiate one write operation of one incoming packet and one read operation of one outgoing packet in each and every cycle. The buffer will consist of two pipelined buffers, with N/2 memories each. Each packet is stored into one or the other of these two buffers. In each and every cycle, one read operation of one outgoing packet is initiated from one of the two buffers, whichever one the desired packet happens to be in. In the same cycle, one write operation of one incoming packet must also be initiated; this will be done into the other one of the two buffers.

While this invention has been described in connection with what is presently considered to be the most practical and preferred embodiment, it is to be understood that the invention is not limited to the described embodiment but, on the contrary, is intended to cover various modifications and equivalent arrangements included within the spirit and scope of the appended claims.

I claim:

1. A data switch for transferring packets of a multiple of N words arriving at the rate of one word per clock cycle on any of M input links, each to a selected one of output links, where N and M are integers, such that N>M, comprising:

a data buffer including a series of N memories, each memory having an access control bus for receiving address and read/write control signals, and control circuitry for successively providing the same access control signals to all of the memories of the series of memories, such that the time separating the receipt of access control signals to one memory from the receipt of the same access control signals to the next memory is equal to at least one complete memory access cycle;

means associated with each input link for providing consecutive words from the input link to the N memories in the order in which said memories are subjected to a same write access by said control circuitry;

means associated with each output link for providing the outputs of the N memories to the output link in the order in which said memories are subjected to a same read access by said control circuitry;

means associated with each memory for successively providing the memory with words present on the input links at the rate at which the memory is subjected to write accesses by said control circuitry, and for successively providing the output links with the output of the memory at the rate the memory is subjected to read accesses by said control circuitry.

2. The data switch according to claim 1, further comprising:

registers for coupling each input link to each data bus of the memories, each register connected to a same input link being write-enabled with one access cycle delay with respect to the preceding register connected to the input link, such that the registers connected to the same input link load consecutive words of a packet coming on the input link;

drivers for coupling each data bus to any of the output links, each driver associated with an output link being controlled in the same manner as the preceding driver associated with the same output link, with one access cycle delay; and the control circuitry for providing the first memory of a buffer with write access control signals, synchronized with the read-enabling of the registers associted with the first memory and with read access control signals synchronized with the control of a driver associated with the first memory, the addresses provided by the control circuitry being such that packets are transferred on corresponding selected output links in the order at which they arrived on the input links.

3. The data switch according to claim 2, wherein the control circuitry comprises means for determining a free output link to which a packet coming on an input link is to be transferred and for read-enabling the registers associated with the input link synchronized with the enabling of the associated drivers.

4. A data switch for transferring packets of N/2 words arriving at the rate of one word per access cycle on any of M input links, each to a selected one of output links, wherein N and M are integers such that N>M, the data switch comprising:

two data buffers, each including a series of N/2 memories, each memory having an access control bus for receiving address and read/write control signals, and control circuitry for successively providing the same access control signals to all of the memories of the series of memories, such that the time separating the receipt of access control signals to one memory from the receipt of the same access control signals to the next memory is equal to at least one complete memory access cycle;

means associated with each input link for providing consecutive words from the input link to the N/2 memories of a first buffer in the order in which the memories of the first buffer are subjected to a same write access by said control circuitry, and for providing other consecutive words from the input link to the N/2 memories of the second buffer in the order in which the memories of the second buffer are subjected to a same write access by said control circuitry;

means associated with each output link for providing the outputs of the N/2 memories of the first buffer to the output link in the order in which the memories of the first buffer are subjected to a same read access by said control circuitry, or providing the outputs of the N/2 memories of the second buffer to the output link in the order at which the memories of the second buffer are subjected to a same read access by said control circuitry; and means associated with each memory of each buffer for successively providing the memory with the words present on the input links at the rate at which the memory is subjected to write accesses by said control circuitry, and for successively providing the output links with the output of the memory at the rate at which the memory is subjected to read accesses by said control circuitry.

5. The data switch according to claim 4, further comprising:

registers for coupling each input link to each data bus of the memories, each register connected to a same input link being write-enabled with one access cycle delay with respect to the preceding register connected to the input link, such that the registers connected to the same input link load consecutive words of a packet coming on the input link;

drivers for coupling each data bus to any of the output links, each driver associated with an output link being controlled like the preceding driver associated with the same output link, with one access cycle delay; and the control circuitry for providing the first memory of a buffer with write access control signals, synchronized with the read-enabling of the registers associated with the first memory and with read access control signals synchronized with the control of a driver associated with the first memory, the addresses provided by the control circuitry being such that packets are transferred on corresponding selected output links in the order they arrived on the input links.

6. The data switch according to claim 5, wherein the control circuitry comprises means for determining a free output link to which a packet coming on an input link is to be transferred and for read-enabling the registers associated with the input link synchronized with the enabling of the associated drivers.

* * * * *